United States Patent
Chen et al.

(10) Patent No.: US 12,265,119 B2
(45) Date of Patent: Apr. 1, 2025

(54) REPACKAGING IC CHIP FOR FAULT IDENTIFICATION

(71) Applicant: Taiwan Semiconductor Manufacturing Company, Ltd., Hsin-Chu (TW)

(72) Inventors: Chien-Yi Chen, Hsinchu (TW); Kao-Chih Liu, Changhua County (TW); Chia Hong Lin, Hsinchu County (TW); Yu-Ting Lin, Hsin-Chu (TW); Min-Feng Ku, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 181 days.

(21) Appl. No.: 18/192,745

(22) Filed: Mar. 30, 2023

(65) Prior Publication Data

US 2024/0036108 A1 Feb. 1, 2024

Related U.S. Application Data

(60) Provisional application No. 63/413,677, filed on Oct. 6, 2022, provisional application No. 63/393,599, filed on Jul. 29, 2022.

(51) Int. Cl.

| | |
|---|---|
| *G01R 31/28* | (2006.01) |
| *G01R 1/04* | (2006.01) |
| *H01L 23/522* | (2006.01) |
| *H01L 23/00* | (2006.01) |

(52) U.S. Cl.
CPC ....... *G01R 31/2896* (2013.01); *G01R 1/0441* (2013.01); *H01L 23/5226* (2013.01);
(Continued)

(58) Field of Classification Search
CPC .......... G01R 31/2896; G01R 1/0441; G01R 31/311; G01R 31/2898; H01L 23/5226;
(Continued)

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |

(Continued)

FOREIGN PATENT DOCUMENTS

| | | |
|---|---|---|
| TW | 201018026 A | 5/2010 |
| TW | 201826420 A | 7/2018 |

(Continued)

*Primary Examiner* — Giovanni Astacio-Oquendo
(74) *Attorney, Agent, or Firm* — HAYNES AND BOONE, LLP

(57) ABSTRACT

A socket of a testing tool is configured to provide testing signals. A device-under-test (DUT) board is configured to provide electrical routing. An integrated circuit (IC) die is disposed between the socket and the DUT board. The testing signals are electrically routed to the IC die through the DUT board. The IC die includes a substrate in which plurality of transistors is formed. A first structure contains a plurality of first metallization components. A second structure contains a plurality of second metallization components. The first structure is disposed over a first side of the substrate. The second structure is disposed over a second side of the substrate opposite the first side. A trench extends through the DUT board and extends partially into the IC die from the second side. A signal detection tool is configured to detect electrical or optical signals generated by the IC die.

20 Claims, 13 Drawing Sheets

(52) U.S. Cl.
CPC .............. *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01)

(58) Field of Classification Search
CPC ......... H01L 24/16; H01L 24/32; H01L 24/73; H01L 2224/16225; H01L 2224/32225; H01L 2224/73204
USPC ........................ 324/762.03, 762.01, 537, 500
See application file for complete search history.

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 10,109,591 | B1 * | 10/2018 | Mescher ............. H01L 23/3675 |
| 11,676,942 | B2 * | 6/2023 | Chen ..................... H01L 25/105 257/668 |
| 2021/0175174 | A1 | 6/2021 | Farooq |
| 2022/0026488 | A1 * | 1/2022 | Kim .................. G01R 31/2893 |
| 2022/0216182 | A1 | 7/2022 | Elsherbini |

FOREIGN PATENT DOCUMENTS

| | | |
|---|---|---|
| TW | 202113382 A | 4/2021 |
| TW | 202135266 A | 9/2021 |

* cited by examiner

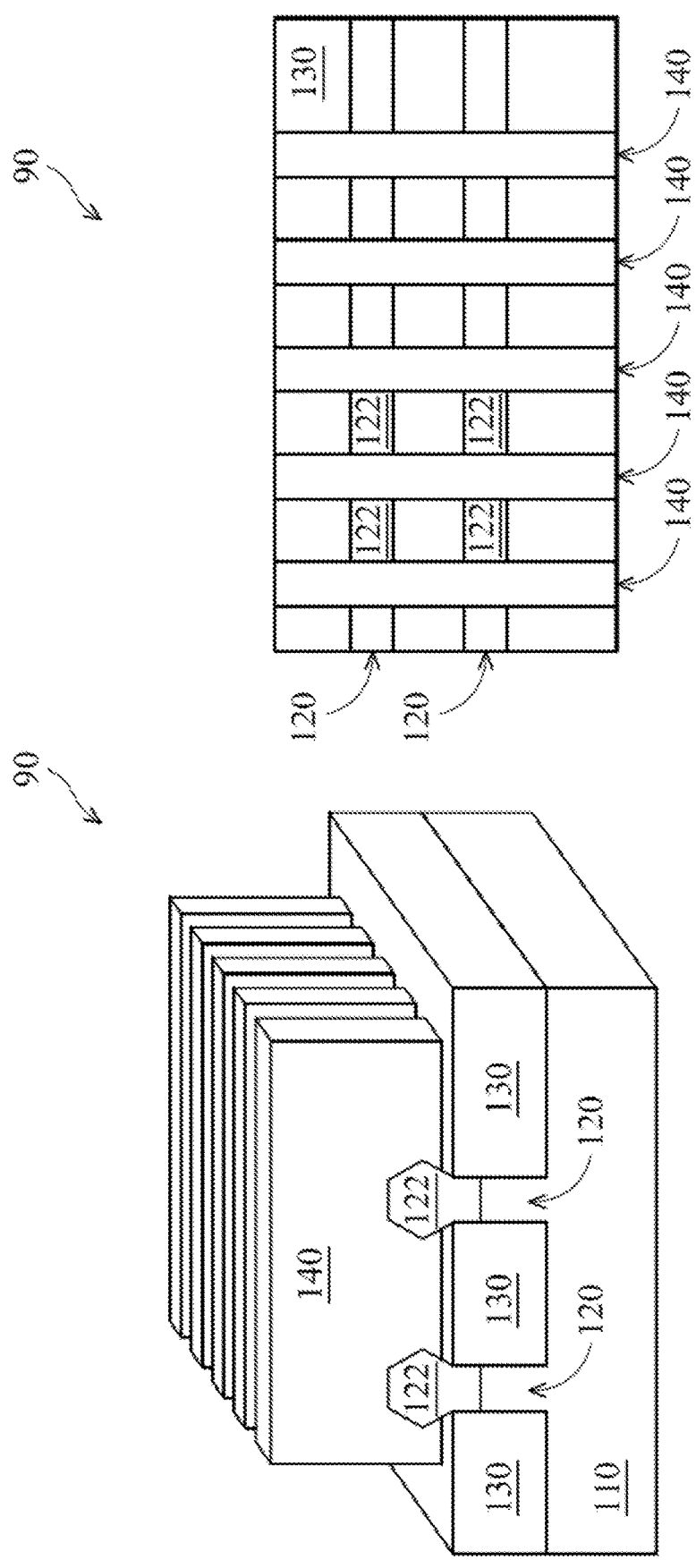
Fig. 1A
Fig. 1B

REPACKAGING IC CHIP FOR FAULT IDENTIFICATION

PRIORITY DATA

The present application is a utility U.S. Patent Application of Provisional U.S. Patent Application 63/393,599, filed on Jul. 29, 2022, entitled "Repackaging Chip For Fault Isolation" and Provisional U.S. Patent application 63/413,677, filed on Oct. 6, 2022, entitled "Repackaging Ic Chip For Fault Identification" the disclosures of which is hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, it has brought about certain fabrication challenges. For example, IC chips that have experienced failures or other performance issues may be tested as a part of debugging process to identify the source of the failures or performance issues. However, as the IC chips are manufactured under ever-smaller technology nodes, the debugging of the IC chips may become increasingly difficult. Often times, the existing circuit components (e.g., existing metallization components) on an IC chip may block or otherwise interfere with the debugging process. As a result, although existing IC chip debugging processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

DETAILED DESCRIPTION

Figure 1C:
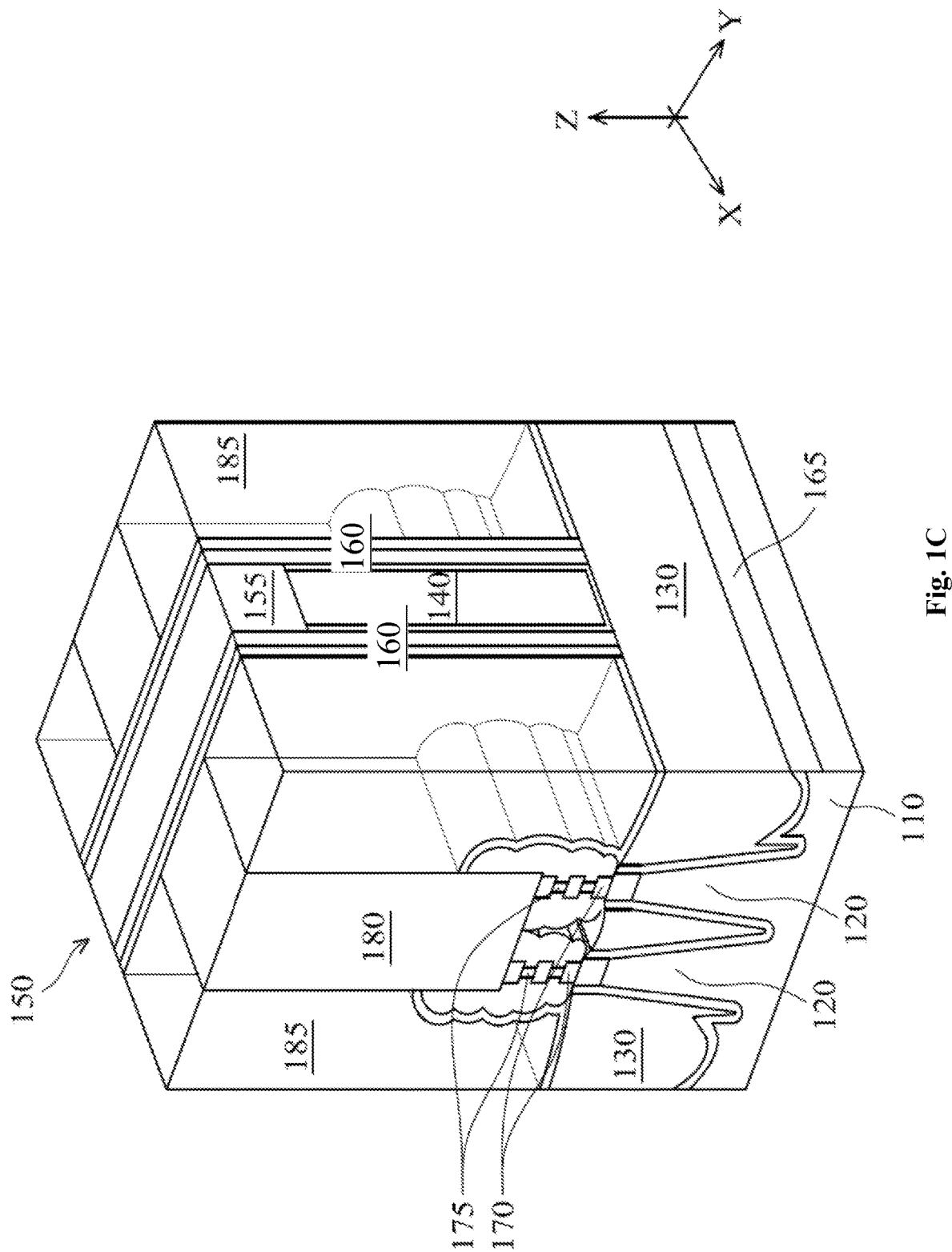
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a unique fabrication process flow to package IC chips, such as Super Power Rail (SPR) chips, such that the IC chips may be conveniently debugged without running into interference issues with the existing metallization components on the IC chips. In more detail, conventional IC chips typically include a semiconductor substrate on (or in) which transistors are formed. Metallization components are then formed on one side (typically referred to as a "front side") of the substrate. The metallization components may include the metal lines or conductive vias that are parts of a multi-layer interconnect structure. As an IC chip undergoes a debugging process to identify faults, electrical testing signals may be sent to the IC chip to force its operation. The IC chip may emit signals in response to being operated, and an emission detecting tool (e.g., an electron beam machine, or e-beam machine) may be placed on the "back side" (e.g., the side opposite the metallization components) of the IC chip to collect the emitted signals. Based on an analysis of the signals emitted from the IC chip under test, the source (e.g., a location of a failure and/or a reason for the failure) of the faults may be identified.

However, as IC chips progress to more advanced technology nodes, some IC chips (e.g., SPR chips) now have metallization components on both sides of the substrate. In other words, metallization components such as metal lines and vias may exist not only on the front side of the substrate, but on the back side of the substrate as well. As such, regardless of where or how the emission detecting tool is placed in relation to the IC chip that is being debugged, the signals emitted by that IC chip may be blocked or otherwise obstructed by the metallization components either on the front side or the back side, which makes testing difficult and unsatisfactory.

Figure 9:
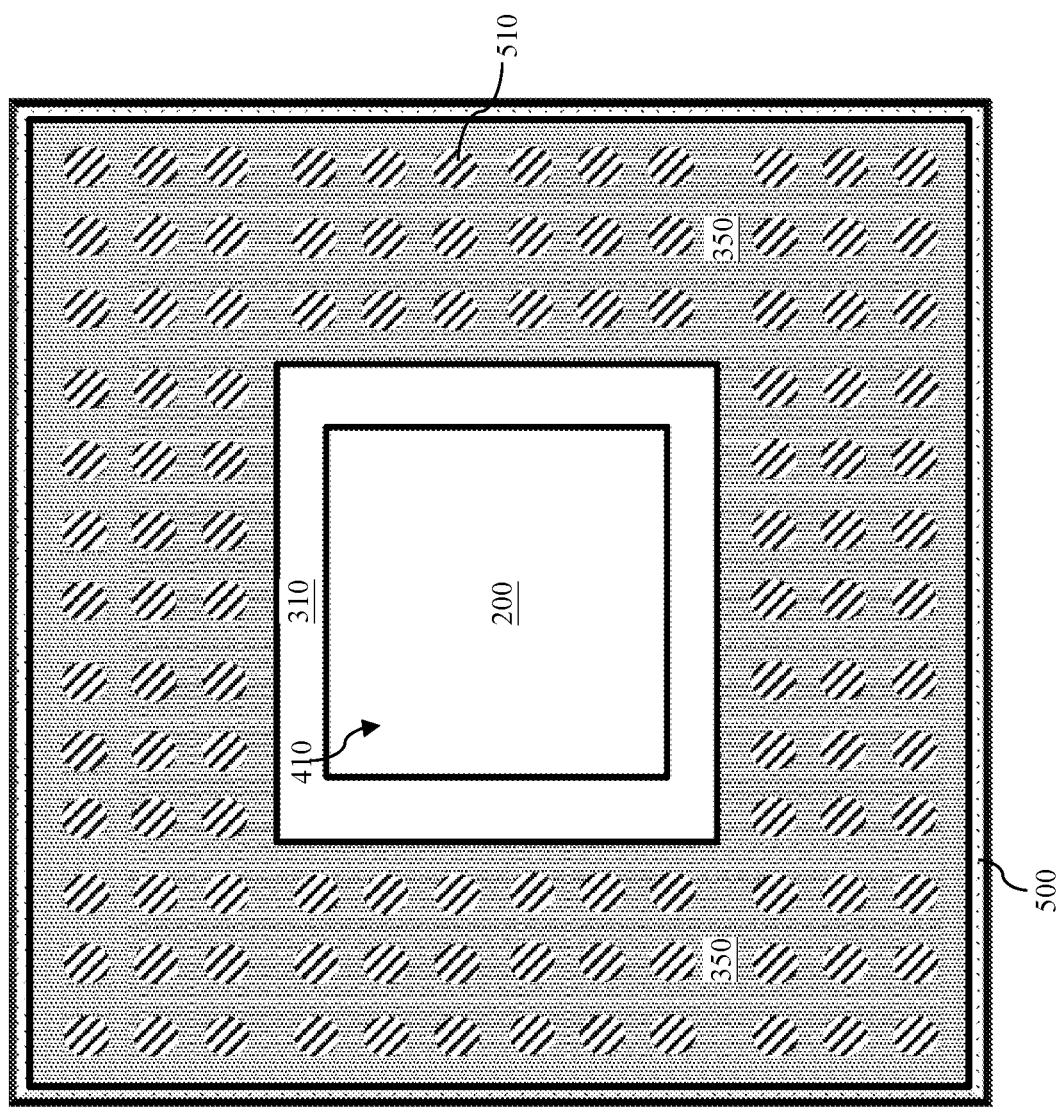
FIG. 9 illustrates a planar top view of the IC die according to embodiments of the present disclosure.
Figure 10:
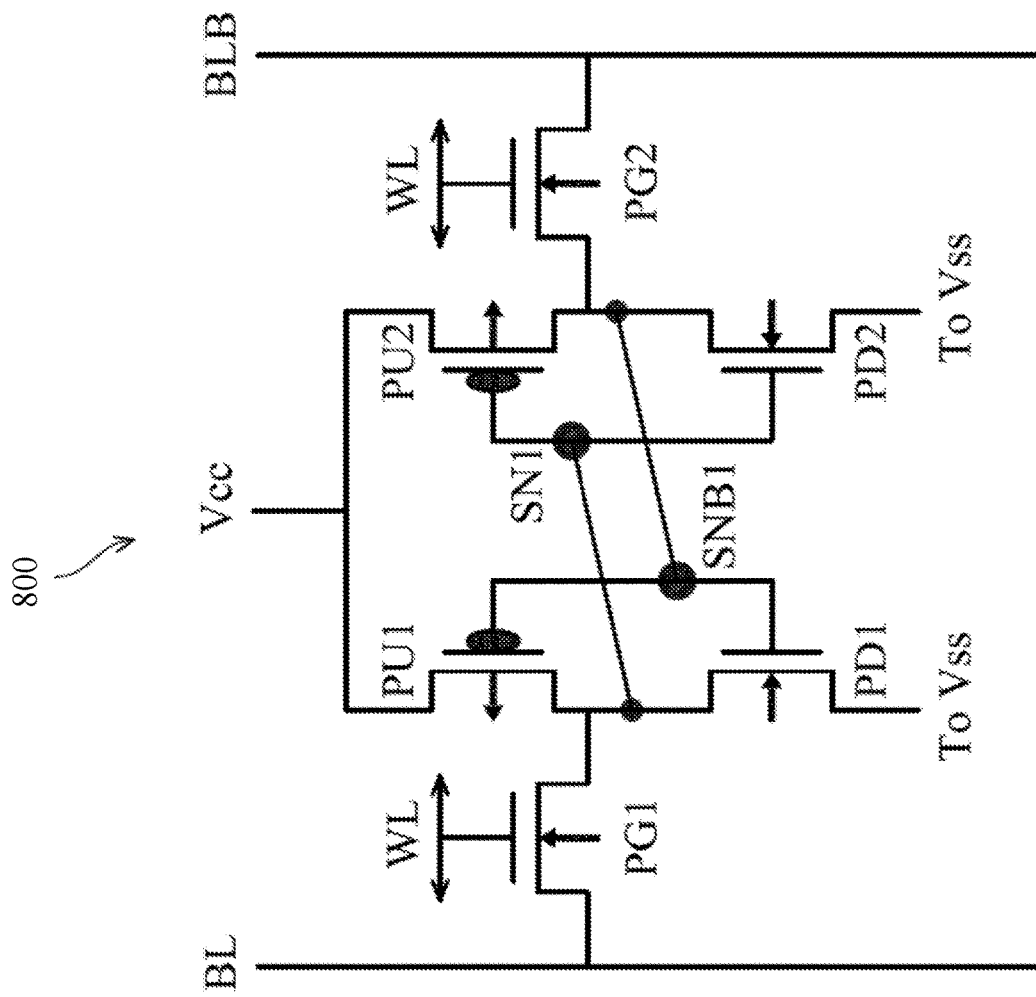
FIG. 10 is a circuit schematic of an SRAM cell according to various aspects of the present disclosure.
Figure 11:
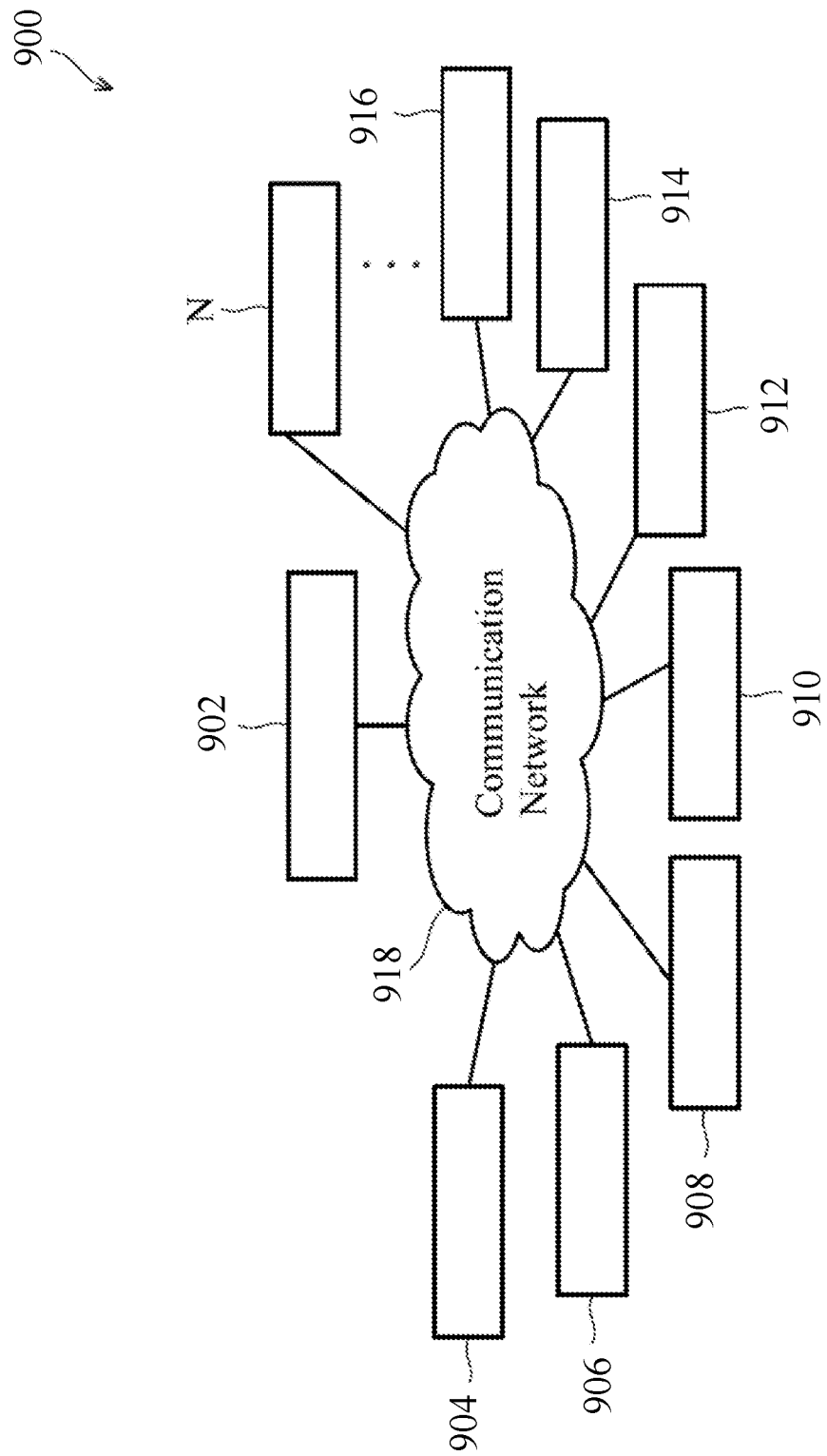
FIG. 11 is a block diagram of a manufacturing system according to various aspects of the present disclosure.

To address the issues discussed above, the present disclosure utilizes a novel packaging and testing process flow to repackage an IC chip that has metallization components on both sides, as discussed below in more detail with reference to FIGS. 1A, 1B, 1C, and 2-11. In more detail, FIGS. 1A-B illustrate an example FinFET device, and FIG. 1C illustrates an example GAA device. FIG. 2-8 illustrate cross-sectional side views of an IC package assembly and/or one or more testing apparatuses at various stages of packaging/testing according to embodiments of the present disclosure. FIG. 9 illustrates a planar top view of the IC package assembly according to embodiments of the present disclosure. FIG. 10 illustrates a memory device in which the IC package assembly of the present disclosure may be implemented. FIG. 11 illustrates a semiconductor fabrication system that may be used to fabricate the IC device of the present disclosure.

Referring now to FIGS. 1A and 1B, a three-dimensional perspective view and a top view of a portion of an Integrated Circuit (IC) device 90 are illustrated, respectively. The IC device 90 is implemented using field-effect transistors (FETs) such as three-dimensional fin-line FETs (FinFETs). FinFET devices have semiconductor fin structures that protrude vertically out of a substrate. The fin structures are active regions, from which source/drain region(s) and/or channel regions are formed. Source/drain region(s) may refer to a source or a drain, individually or collectively dependent upon the context. A source/drain region may also refer to a region that provides a source and/or drain for multiple devices. The gate structures partially wrap around the fin structures. In recent years, FinFET devices have gained popularity due to their enhanced performance compared to conventional planar transistors.

As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 (also referred to source/drain regions) may refer to a source or a drain of a transistor, individually or collectively, dependent upon the context. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structures 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example multi-channel gate-all-around (GAA) device 150. GAA devices have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A layer 155 is located over the gate structure 140, and gate spacer structures 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

The FinFET devices of FIGS. 1A-1B and the GAA devices of FIG. 1C may be utilized to implement electrical circuitries having various functionalities, such as memory devices (e.g., static random access memory (SRAM) devices), logic circuitries, input/output (I/O) devices, application specific integrated circuit (ASIC) devices, radio frequency (RF) circuitries, drivers, micro-controllers, central processing units (CPUs), image sensors, etc., as non-limiting examples.

Figure 2:
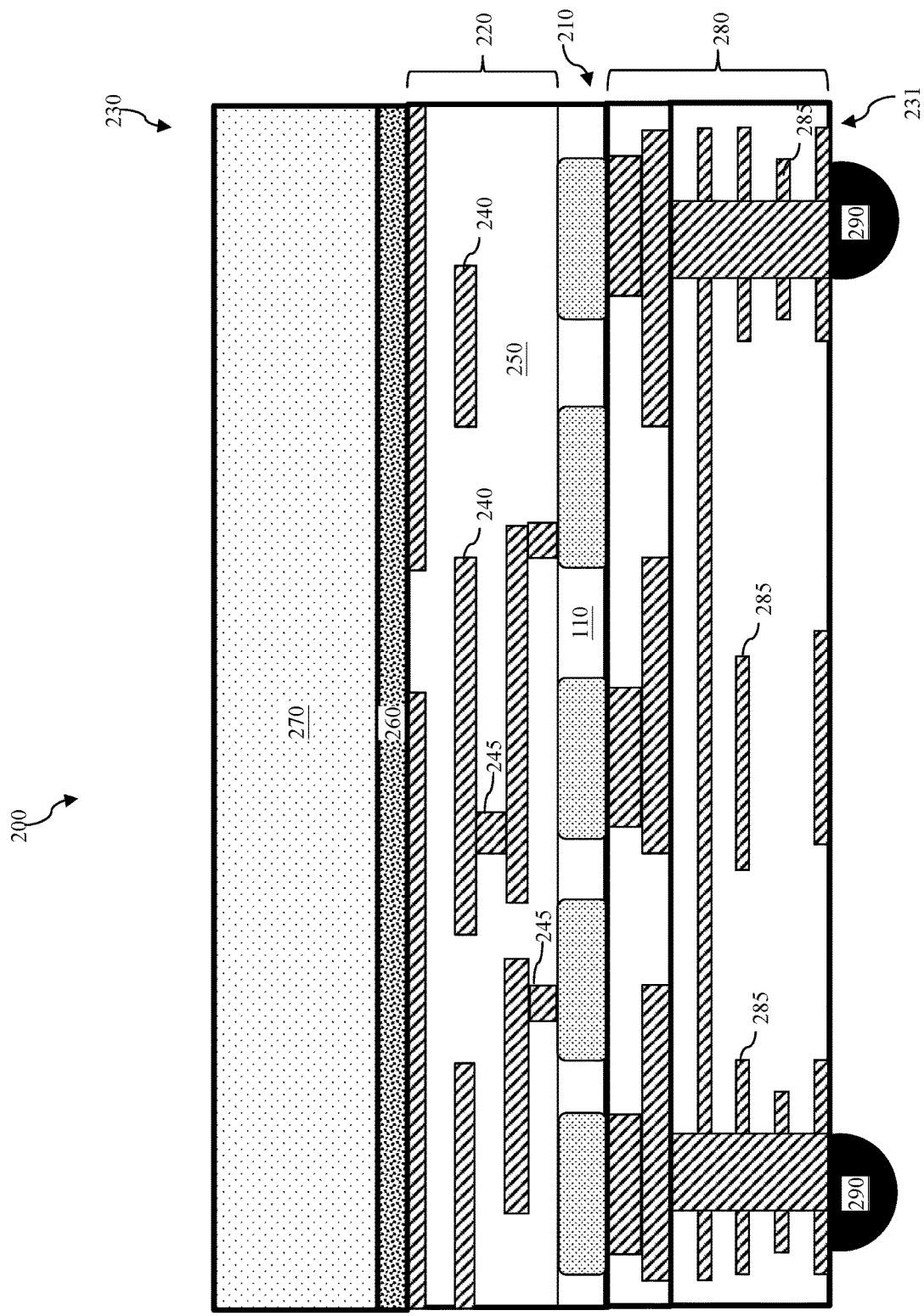
FIGS. 2-8 illustrate a series of cross-sectional side views of an IC die and one or more testing structures at various stages of testing according to embodiments of the present disclosure.

FIG. 2 illustrates a diagrammatic fragmentary cross-sectional side view of an IC die 200 that contains the FinFET or GAA transistors of FIGS. 1A-1C discussed above according to various embodiments of the present disclosure. The IC die 200 has metallization components on both its front side and its back side. As discussed above, such an arrangement of the metallization components could cause the signals emitted by the IC die 200 (and meant to be detected by a detection tool) to be blocked by the metallization components, which could interfere with a debugging process. To address this issue, the present disclosure involves a novel packaging process flow, so that the signals emitted by the IC chip can be detected by the detection tool without obstruction, as will be discussed in more detail below with reference to FIGS. 3-9.

Still referring to FIG. 2, the IC die 200 in the illustrated embodiment is a Super Power Rail (SPR) chip. In that regard, in conventional chip structures, source/drain contacts and gate contacts of transistors on a substrate connect source/drain features of the transistors to an interconnect structure over a front side of the substrate. As the dimensions of IC devices shrink, the close proximity among the source contacts and gate contacts may reduce process windows for forming these contacts and may increase parasitic capacitance among them. To alleviate these concerns, SPR chips may implement a backside source/drain contact through the substrate of the SPR chip to come in contact with a source/drain feature, and a power rail is formed on the backside of the substrate to be in contact with the backside source/drain contact. Since the implementation of SPR structures eases the crowding of contacts, SPR chips entail a modern solution for performance boost on power delivery network (PDN) for advanced technology nodes.

Additional details of the IC die 200 are now discussed below. The IC die 200 includes a plurality of transistors 210. The transistors 210 may be formed in or on the substrate 110 discussed above, which may comprise an elementary (single element) semiconductor, a compound semiconductor, an alloy semiconductor, and/or other suitable materials. The transistors 210 may include the FinFET transistors shown in FIGS. 1B-1C and/or the GAA transistors shown in FIG. 1C. The transistors 210 may include active regions, such the fin structures 120 or the stacks of nano-structures 170 discussed above in association with FIGS. 1A-1C. The transistors 210 also include High-k metal gate (HKMG) structures 140 discussed above, which may partially wrap around the active regions (e.g., wrapping around a fin structure). As discussed above, the HKMG structures may be formed by replacing dummy gate structures, and they may each include a high-k gate dielectric and a metal-containing gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), titanium aluminum nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. For reasons of simplicity, the details of the transistors 210 are not illustrated in FIG. 2 or the subsequent figures.

The substrate 110 has two opposite sides, for example, a side 230 and a side 231. The side 230 may also be interchangeably referred to hereinafter as a front side of the IC die 200, and the side 231 may also be interchangeably referred to hereinafter as a back side of the IC die 200. A multi-layer interconnect structure 220 is formed on the side 230 of the substrate 110. The interconnect structure 220 includes a plurality of patterned dielectric layers and interconnected conductive layers. These interconnected conductive layers provide interconnections (e.g., wiring) between circuitries, inputs/outputs, and various doped features formed in the substrate 110. For example, the interconnect structure 220 may include a plurality of interconnect layers, also referred to as metal layers (e.g., M1, M2, M3, etc). Each of the interconnect layers includes a plurality metal lines, such as metal lines 240. The interconnect structure 220 may also include a plurality of conductive vias, such as conductive vias 245, that electrically couple the various metal lines 240 together. The metal lines 240 and the conductive vias 245 may contain conductive materials, such as aluminum, copper, aluminum alloy, copper alloy, aluminum/silicon/copper alloy, titanium, titanium nitride, tantalum, tantalum nitride, tungsten, cobalt, ruthenium, metal silicide, or combinations thereof. The interconnect structure 220 also includes an interlayer dielectric (ILD) 250 that provides electrical and physical isolation between the interconnect layers. The ILD 250 may include a dielectric material such as an oxide material or a low-k dielectric. It may be said that the metal lines 240 and the conductive vias 245 are embedded in the ILD 250.

A bonding layer 260 is disposed over the interconnect structure 220. In some embodiments, the bonding layer 260 includes an oxide material. The bonding layer 260 bonds a carrier substrate 270 to a rest of the IC die 200. For example, the interconnect structure 220 is bonded to the carrier substrate 270 through the bonding layer 260. In some embodiments, the carrier substrate 270 includes bulk silicon. In other embodiments, the carrier substrate 270 includes another suitable material that provides sufficient rigidity and/or mechanical support for the rest of the IC die 200.

While the interconnect structure 220, the bonding layer 260, and the carrier substrate 270 are located on the side 230 (e.g., the front side) of the substrate 110, a power delivery network (PDN) 280 is formed on the side 231 (e.g., the back side) of the substrate 110. The PDN 280 is a structure that delivers power and ground voltages from conductive pad locations to the various components (e.g., the transistors 210) of the IC die 200. In some embodiments, the PDN 280 includes a plurality of layers, where each layer includes one or more rails 285, such as power rails and/or ground rails. The power rails or ground rails may be in the form of metal lines. The various layers of the PDN 280 may be electrically interconnected together by conductive vias. Electrical connectivity to the PDN 280 (and to the rest of the IC die 200) may be gained by conductive bumps 290 (e.g., solder balls) that are located on the side 231 of the PDN 280.

Since the PDN 280 includes metal lines and vias, as does the interconnect structure 220, it may be said that the IC die 200 has metallization components formed on both its front side 230 and its back side 231. In conventional IC chips where no PDN is implemented on its back side (i.e., similar to back side 231 herein), signals emitted by the IC chip when the IC chip is being debugged may be detected by a detection tool placed on the back side of the IC chip without obstruction or interference from metallization components. However, for the IC die 200 illustrated herein, the metal lines and/or vias of the PDN 280 may at least partially block the transmission of the signals emitted by the IC die 200. To address this issue, the present disclosure involves a packaging process where an opening or trench is formed on the back side 231, which extends at least partially through the PDN 280. Such an opening allows the signals emitted by the IC die 200 to reach a signal detection tool placed on the back side 231 without being obstructed, as discussed in greater detail below.

Figure 3:
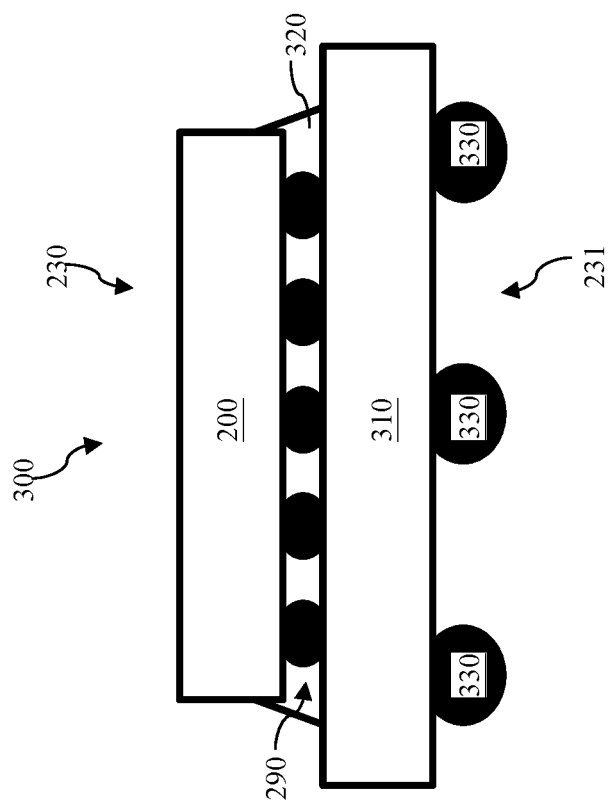

FIGS. 3-8 illustrate diagrammatic fragmentary side views of the IC die 200 in conjunction with other devices at various stages of a packaging/testing process according to an embodiment of the present disclosure. Referring now to FIG. 3, an IC package assembly 300, which may also be referred as an IC chip, includes the IC die 200 and a substrate 310. In some embodiments, the substrate 310 include a printed circuit board (PCB), which may include a plurality of layers that are each configured for routing electrical signals. For example, the PCB may include a plurality of metal lines in each of the layers, as well as vias that interconnect the metals from different layers. The PCB may also include a dielectric material that provides electrical and physical isolation for the metal lines and vias.

The IC die 200 is bonded to the substrate 310 through the back side 231. For example, the conductive bumps 290 and a molding material 320 (e.g., an organic material) are bonded between the IC die 200 and the substrate 310. The conductive bumps 290 allow electrical signals to be transmitted between the IC die 200 and the substrate 310, while the molding material 320 provides electrical isolation and physical protection for the conductive bumps 290 and other components on the surfaces of the IC die 200 and the substrate 310. As such, the various layers of the PCB may be utilized to perform additional electrical routing for the IC die 200. In some embodiments, the substrate 310 includes electrical routing components but no active circuitry (e.g., no transistors). In some other embodiments, the substrate 310 may include additional electrical circuitry, which may provide the same functionalities as the electrical circuitry on the IC die 200 or may provide different functionalities from the electrical circuitry on the IC die 200. Note that a plurality of conductive bumps 330 may also be implemented on the back side 231 of the substrate 310. The conductive bumps 330 are electrically coupled to the internal components of the substrate 310, such that electrical access to the substrate 310 (and by extension, to the IC die 200) may be gained at least in part through the conductive bumps 330.

In some embodiments, the IC package assembly 300 may be an apparatus that is ready for sale to customers. In other words, a customer may purchase the IC package assembly 300 from its manufacturer and implement the IC package assembly 300 on modern day electronic devices, such as desktop or laptop computers, mobile telephones, televisions, radios, automobiles, satellite positioning devices, household appliances, etc. However, from time to time, copies of the IC package assembly 300 may experience failure or fault conditions, either during actual use or during testing before or after it is shipped to a customer. Such a failed or buggy copy of the IC package assembly 300 may then be tested as a part of a debugging process to identify the reason and/or source of the failure. In such a debugging process, it may be desirable to detect signals emitted from the IC die 200 from the back side 231. In order to make ensure that the metallization features of the PDN 280 do not obstruct or interfere with the emission of the signals from the IC die 200, an opening or trench will be formed from the back side 231, where the opening or trench extends at least partially through the PDN 280 to expose a target region of the transistors 210. The signals emitted from the target region of the transistors 210 may then be collected by the signal detection tool placed on the back side 231 without obstruction from the PDN 280, as discussed in more detail below.

Figure 4:
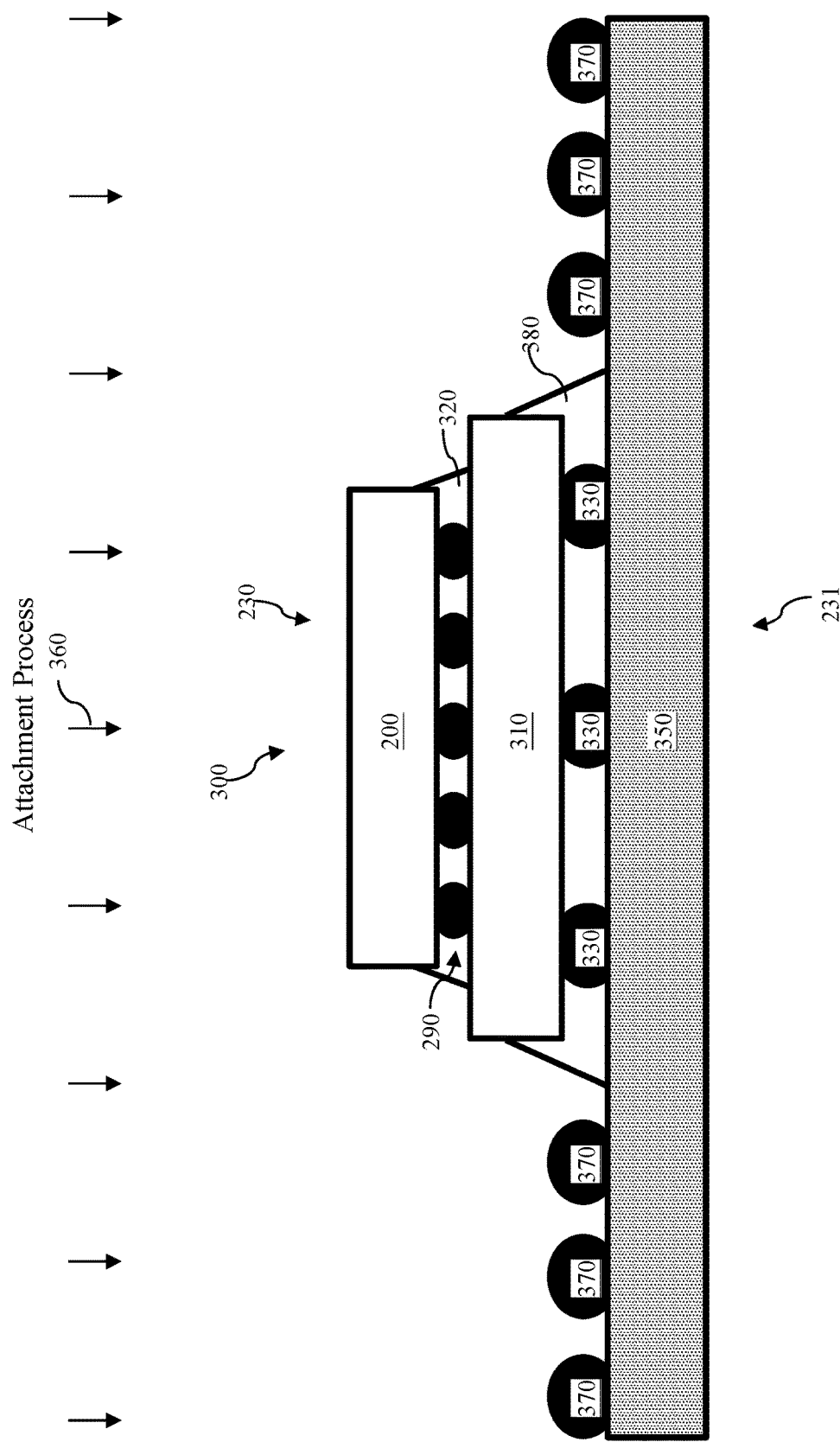

Referring now to FIG. 4, the IC package assembly 300 is attached to a device-under-test (DUT) board 350 through an attachment process 360. The DUT board 350 may be a first part of an automated test equipment (ATE) tool that is configured to test IC chips such as the IC package assembly 300 (or the IC die 200). The DUT board 350 may contain metallization components therein, for example, one or more layers of metal lines and/or vias, so as to provide electrical routing. The DUT board 350 may also include a plurality of conductive bumps 370 (e.g., solder balls). The conductive bumps 370 are electrically connected to the various metallization components in the DUT board 350. As a part of the attachment process 360, a subset of the conductive bumps 370 may be connected to the conductive bumps 330 of the IC package assembly 300. In this manner, electrical access to the internal electrical circuitries of the IC die 200 may be gained through the DUT board 350. The interface between the IC package assembly 300 and the DUT board 350 may be covered by a suitable material 380, so as to protect the surfaces of the IC package assembly 300 and the DUT board 350 from external sources of contamination, such as dust particles or moisture. In some embodiments, the material 380 may include a molding compound, such as an organic material.

Figure 5:
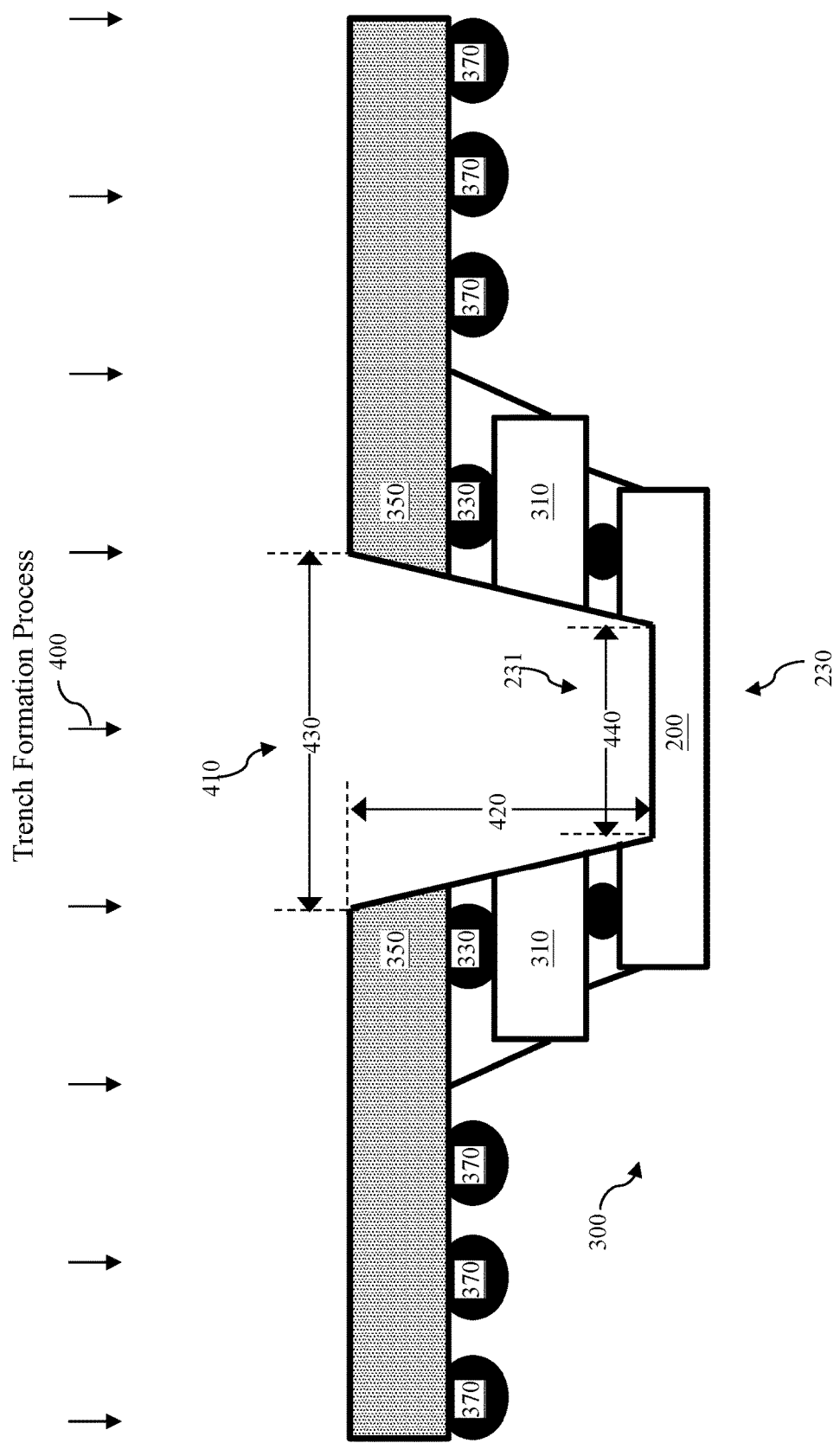

Referring now to FIG. 5, the IC package assembly 300 and the DUT board 350 to which it is attached are vertically flipped over, such that the front side 230 and the back side 231 are opposite what they were in FIG. 4. In other words, the front side 230 is pointing downwards in FIG. 5, and the back side 231 is pointing upwards in FIG. 5. A trench formation process 400 is then performed to the IC package assembly 300 and the DUT board 350 to form a trench 410 (also interchangeably referred to as an opening 410). In some embodiments, the trench formation process 400 involves using a small mechanical drill bit to drill the trench 410. In some embodiments, the diameter of the mechanical drill bit may be in the range of several microns, or several tens of microns.

The trench 410 extends vertically (from the back side 231 toward the front side 230) through the DUT board 350, through the substrate 310, and partially through the IC die 200. Although it may not be readily apparent from FIG. 5—which is not drawn in scale—the trench 410 has a high aspect ratio, which is a ratio of its depth 420 versus its width 430 or 440. For example, the depth 420 may be measured as a vertical dimension from the topmost surface of the DUT board 350 to the exposed upper surface of the IC die 200. In some embodiments, the depth 420 may be in a range between about 2 millimeters (mm) and about 4 mm. The width 430 may be measured as a horizontal or lateral dimension of the uppermost part of the trench 410. The width 440 may be measured as a horizontal or lateral dimension of a bottommost part of the trench 410 (or a window right at the exposed portion of the IC die 200). In some embodiments, the width 430 may be a maximum width of the trench 410, and the width 440 may be a minimum width of the trench 410.

Regardless of where the width of the trench 410 is measured, it is substantially smaller than the depth 420 of the trench 410. In some embodiments, the width 430 is in a range between about 0.5 micron and about 3 microns, and the width 440 is in a range between about 0.05 micron and about 0.3 microns. Due to the size discrepancies between the depth 420 and the width 430, the aspect ratio of the trench 410 can be large. In some embodiments, the aspect ratio of the trench 410 (e.g., the depth 420 versus the width 430, or the depth 420 versus the width 440) is in a range between about 1000:1 and about 2000:1.

Figure 6:
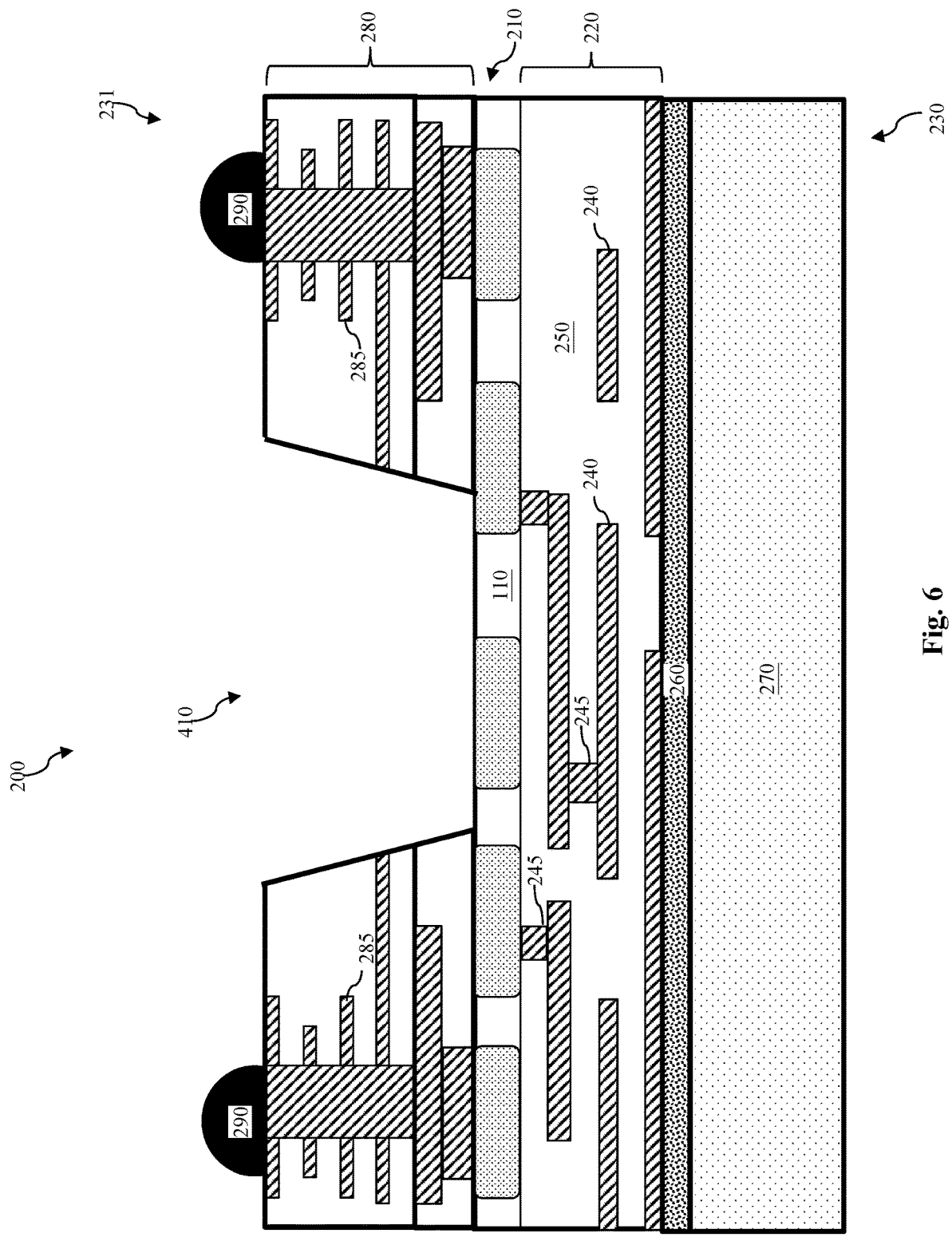

As shown in FIG. 5, a portion of the IC die 200 is removed during the trench formation process 400. The removed portion of the IC die 200 comes from the PDN 280 discussed above. This is illustrated more clearly in FIG. 6, which again shows the cross-sectional side view of the IC die 200, but with the trench 410 already formed. The trench 410 extends vertically through the PDN 280 from the back side 231 toward the front side 230 and exposes some of the transistors 210. It is understood that some of the metallization components (e.g., metal lines or vias) of the PDN 280 may be at least partially removed by the formation of the trench 410. The removal of these metallization components allows electrical or optical signals generated by the transistors 210 (exposed by the trench 410) to be freely emitted through the trench 410 and detected by a detection tool as a part of a debugging process. Note that although the illustrated embodiment of FIG. 6 shows the trench 410 as extending vertically completely through the PDN 280, this may not be the case in other embodiments. For example, in some alternative embodiments, the trench 410 may extend partially through the PDN 280 and exposes one or more of the metallization components of the PDN 280 instead.

It is also understood that the removal of the metallization components of the PDN 280 herein also does not substantially interfere with the intended functionalities of the PDN 280, since the metallization components in the PDN 280 may have a certain degree of redundancy built in. In other words, the power rails and/or ground lines may be served by a plurality of the metallization components of the PDN 280. A removal of a subset of these metallization components of the PDN does not substantially disrupt the functionalities of the rest of the metallization components that also serve as the power rails or ground lines, as long as a sufficient number of the remaining metallization components can adequately duplicate the functionalities of the removed metallization components.

Figure 7:
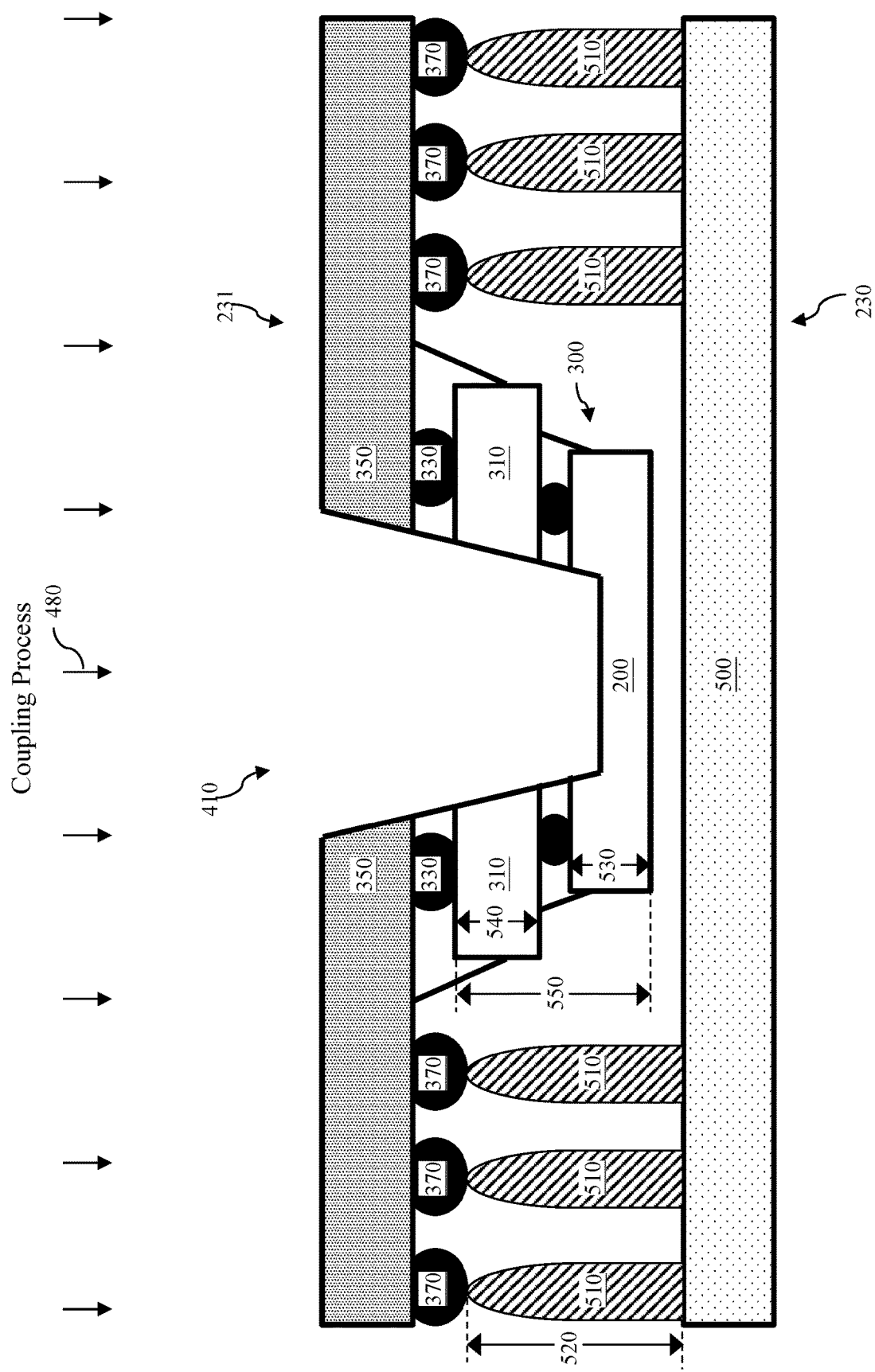

Referring now to FIG. 7, after the trench 410 has been formed in the IC package assembly 300 and the DUT board 350, a coupling process 480 is performed to couple a socket 500 to the IC package assembly 300 and the DUT board 350. In some embodiments, the socket 500 may be a second part of the ATE tool (of which the DUT board 350 is a part) that is configured to test IC chips such as the IC die 200. In other words, the socket 500 works in conjunction with the DUT board 350 to facilitate the testing of the IC chips such as the IC die 200. The socket 500 is placed on the front side 230 of the IC die 200, but there need not be physical contact between the socket 500 and the IC die 200. For example, in some embodiments, the spacing between the socket 500 and the IC die 200 may be filled by a buffer material to prevent potential damage to the IC die 200. In other embodiments, the spacing between the socket 500 and the IC die 200 may be an empty air space.

The socket 500 may provide electrical testing signals that, when received by the IC die 200, will force certain parts of the IC die 200 to undergo various electrical operations. These electrical operations may include the intended electrical operations that should be performed by the IC die 200 during a normal operation of the IC die 200. In some embodiments, the socket 500 may provide electrical signals that emulate the signals generated by a controller or a microcontroller. In any case, the testing signals provided by the socket 500 may force the target region of the IC die 200 (e.g., the region exposed by the trench 410) to perform certain operations as a part of a debugging process. As discussed above, the transistors 210 from the target region of the IC die 200 may emit signals in response to being forced to operate in a certain manner based on the received testing signals. The emitted signals may propagate through the trench 410 without being obstructed by the metallization components of the PDN 280 of the IC die 200, which allows the emitted signals to be detected by a detection tool (discussed below with reference to FIG. 8).

In order for the testing signals provided by the socket 500 to reach their intended targets (e.g., the various transistors from the exposed regions of the IC die 200), a plurality of electrically conductive structures 510 are implemented on the back side 231 of the socket 500 to transmit or relay the testing signals. In some embodiments, the electrically conductive structures 510 may be vertically retractable conductive pins. In some embodiments, the electrically conductive structures 510 may include pogo pins. As shown in FIG. 7, each of the electrically conductive structures 510 may be matched up (or aligned with) a respective one of the conductive bumps 370 located on the front side 230 of the DUT board 350. After coming into physical and electrical contact with the conductive bumps 370, the electrically conductive structures 510 may transmit the testing signals provided by the socket 500 to the DUT board 350 through the conductive bumps 370. The DUT board then routes the testing signals to the substrate 310, which in turn routes the testing signals to the target transistors of the IC die 200.

It is understood that the physical arrangement of the IC die 200, the substrate 310, the DUT board 350, and the socket 500 is one of the unique characteristics (as well as an inherent result) of the processes performed by the present disclosure. For example, the fact that the DUT board 350 and the socket 500 are located on opposite sides (e.g., the back side 231 and the front side 230, respectively) of the IC die 200 is not found in conventional testing structural arrangements. However, such a relative disposition between the DUT board 350 and the socket 500 also increases a distance between the DUT board 350 and the socket 500. To account for such an increased distance, the present disclosure configures a height 520 (or vertical dimension) of the electrically conductive structures 510 to be sufficiently long to reach the conductive bumps 370 that are located on the DUT board 350. In other words, compared to equivalent electrically conductive structures implemented on conventional sockets, the electrically conductive structures 510 herein are substantially lengthened. For example, whereas a height of an equivalent electrically conductive structures on conventional sockets may be in a range between about 0.2 millimeters (mm) and about 0.3 mm, the height 520 may be at least 1.5 times longer and may be in a range between about 0.38 mm and about 0.48 mm.

The increased height 520 may also be reflected as various ratios versus a height of one or more other components of the IC die 200. In some embodiments, a height 530 (or thickness) of the IC die 200 is in a range between about 10 microns and about 50 microns, and a ratio of the height 520 and the height 530 may be in a range between about 10:1 and about 20:1. In some embodiments, a height 540 (or thickness) of the substrate 310 is in a range between about 800 microns and about 1200 microns, and a ratio of the height 520 and the height 540 may be in a range between about 0.38:1 and about 0.48:1. In some embodiments, a height 550 of the IC package assembly 300 (e.g., the combined heights of the IC die 200, the substrate 310, and the spacing between them) is in a range between about 1.26 mm and about 1.4 mm, and a ratio of the height 520 and the height 550 may be in a range between about 0.3:1 and about 0.35:1. The corresponding ratios for a conventional structure would be substantially lower (e.g., at least 33% lower) than the values provided herein. Again, the relatively tall height 520 enables the physical and electrical coupling between the DUT board 350 and the socket 500, even though the IC die 200 is disposed between the DUT board 350 and the socket 500.

Figure 8:
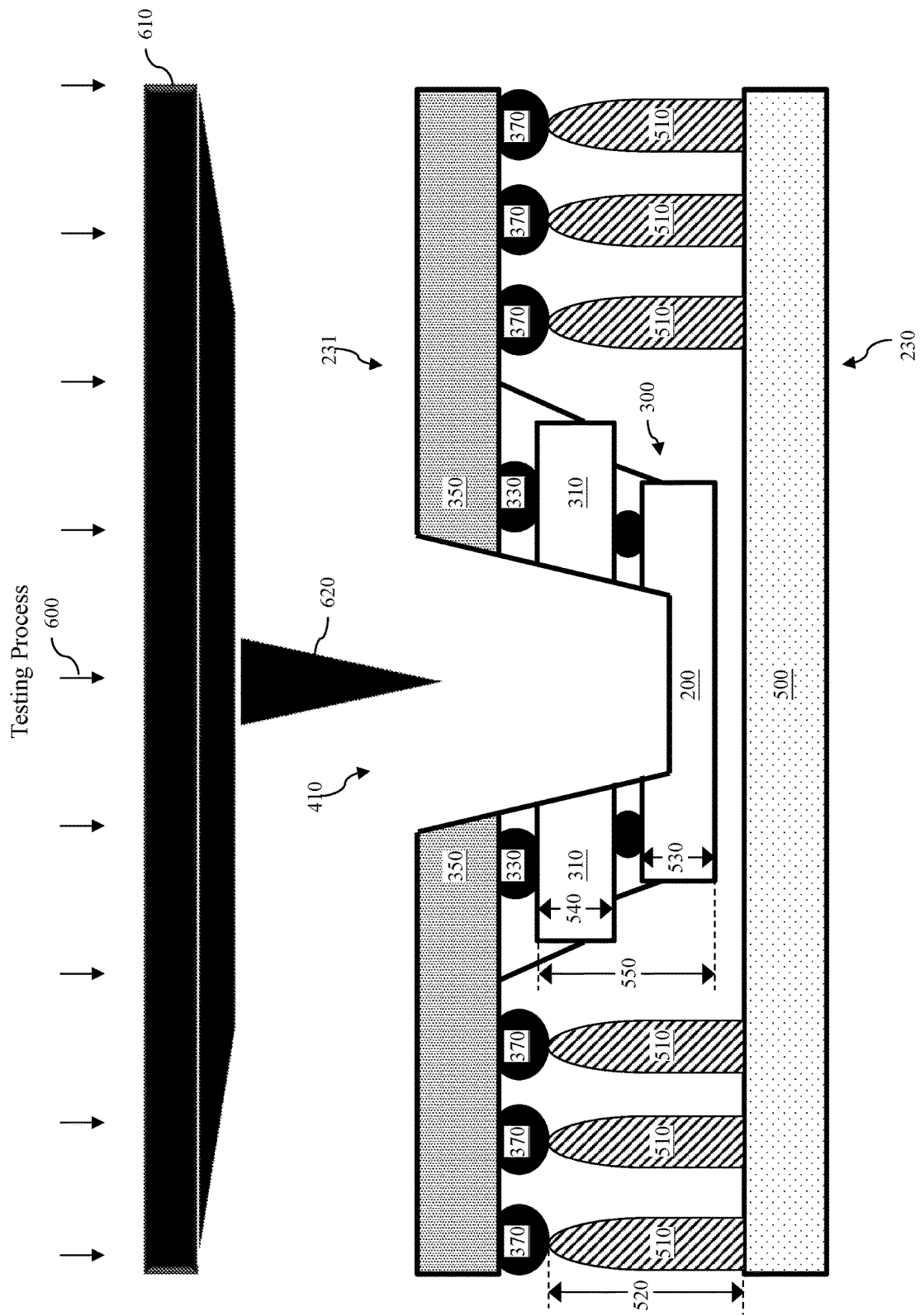

Referring now to FIG. 8, a testing process 600 is performed using the tools discussed above (e.g., the DUT board 350 and the socket 500) and also a detection tool 610. The detection tool 610 may be configured to detect signals 620 (which may be electrical signals or optical signals) emitted by the IC die 200, where the signals 620 are emitted in response to the IC die 200 being forced into a particular mode of operation after receiving the testing signals from the socket 500. In some embodiments, the detection tool 610 includes an electron beam (e-beam) machine.

The detection tool 610 (and/or the ATE tool) may analyze the signals 620 and translate them into a plot, a graph, an image, a plurality of numbers, or another suitable analytical result. Based on the analytical result produced by the detection tool 610 (or by the ATE tool), a machine or an engineer/technician may identify the portions of the circuitry of the IC die 200 that produced a fault or failure. For example, based on the analytical result, a determination may be made that two transistors in a region A of the IC die 200 that should have been electrically isolated have somehow been electrically shorted together. As another example, based on the analytical result, a determination may be made that a transistor in a region B of the IC die 200 is producing too much, or not enough, electrical current (e.g., greater than or less than a predefined threshold). As yet another example, based on the analytical result, a determination may be made that a microelectronic component (e.g., a source/drain or a gate) in a region C of the IC die 200 is missing or is structurally defective due to a fabrication-related issue. It is understood that these faults discussed above are merely examples and are not intended to be limiting.

Once the faults or their causes/sources have been identified, they can be communicated to appropriate personnel (and/or machines), so that manufacturing processes of the IC chips may be adjusted to reduce or eliminate the likelihood of these faults occurring in the future. As a result, device performance and/or yield may be improved. Again, although the presence of metallization components on both the front side 230 and the back side 231 of the IC die 200 herein may complicate the debugging of the IC die 200, the solutions devised by the present disclosure discussed above can sufficiently address the issues that arise. For example, by forming a trench that partially removes the metallization components in the PDN 280 of the IC die 200, the signals emitted by the IC die 200 during the testing process 600 may be collected by the detection tool 610 without interference from the metallization components. In addition, the electrically conductive structures 510 are also lengthened to account for the greater spacing between the DUT board 350 and the socket 500 as an inherent result of the physical arrangement utilized to set up the IC die 200 to undergo testing process 600.

It is also understood that, although the metallization components of the PDN 280 have been used as an example material that could be removed to prevent them from blocking the propagation of signals emitted by IC chips during a debugging process, similar concepts may apply to other types of optically opaque and/or electrically non-conductive materials as well. In other words, another type of IC chip may include optically opaque and/or electrically non-conductive materials on both sides. To facilitate the testing of such an IC chip as a part of its debugging process, an opening may be formed to remove a portion of the optically opaque or electrically non-conductive material from one side of the IC chip, so that signals emitted by the IC chip during its testing may still be freely detected by a detection tool through the opening.

To further illustrate the various aspects of the present disclosure, a top view (also referred to as a planar view) of the various components of the present disclosure is illustrated in FIG. 9. In more detail, the top view of FIG. 9 is obtained by looking down from the back side 231 toward the front side 230. FIG. 9 illustrates portions of the IC die 200, the substrate 310, the DUT board 350, the socket 500, and the electrically conductive structures 510 (e.g., in the form of pogo pins), but not the detection tool 610.

As shown in FIG. 9, the trench 410 exposes a portion of the IC die 200 (as well as a portion of the substrate 310. The exposed portion of the IC die 200 allows electrical or optical signals emitted by the IC die 200 to propagate toward the detection tool 610 (see FIG. 8) without being blocked by the metallization components of the PDN 280. In the embodiment shown in FIG. 9, the trench 410 is shaped as a rectangle or a square. However, such a shape is not intended to be limiting, and the trench 410 may be configured to have other shapes in other embodiments, such as circles, ovals, triangles, or an arbitrary shape. It is also understood that the location of the trench 410 is not fixed but can be moved in various embodiments. For example, the embodiment of FIG. 9 may configure the trench 410 to be located near a center of the IC die 200, as that region of the IC chip is preliminarily determined to be the region of the IC chip where the faulty circuitry is located. However, suppose that a top left corner region of the IC die 200 is suspected of being the region that contains the faulty circuitry, then the trench 410 may be formed at or near the top left corner region of the IC chip to expose the transistors in that region, so that the signals emitted by the circuitry in the top left corner region of the IC die 200 may be detected by the detection tool 610 without obstruction.

The IC die 200 (or the IC package assembly 300) may be implemented in a variety of IC applications, including memory devices such as Static Random-Access Memory (SRAM) devices. In that regard, FIG. 10 illustrates an example circuit schematic for a single-port SRAM cell (e.g., 1-bit SRAM cell) 800 in which the IC die 200 may be implemented. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 11 illustrates an integrated circuit fabrication system 900 according to embodiments of the present disclosure, which may be used to fabricate the IC die 200 and/or the IC package assembly 300 of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 12:
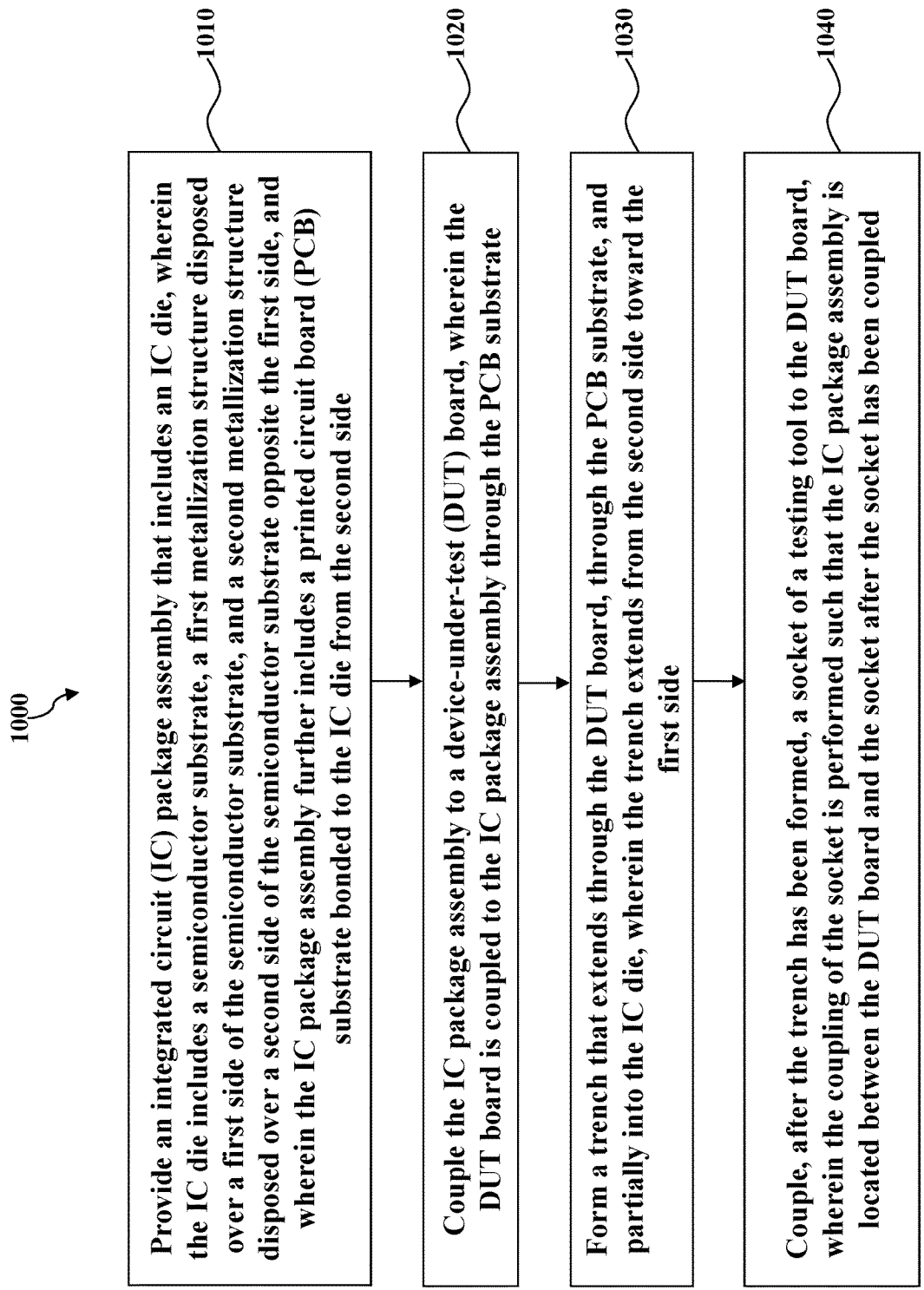
FIG. 12 is a block diagram of a method of packaging and testing an IC device according to various aspects of the present disclosure.

FIG. 12 is a flowchart illustrating a method 1000 of packaging and testing an IC package assembly according to various aspects of the present disclosure. The method 1000 includes a step 1010 to provide an integrated circuit (IC) package assembly that includes an IC die. The IC die includes a semiconductor substrate, a first metallization structure disposed over a first side of the semiconductor substrate, and a second metallization structure disposed over a second side of the semiconductor substrate opposite the first side. The IC package assembly further includes a printed circuit board (PCB) substrate bonded to the IC die from the second side.

The method 1000 includes a step 1020 to couple the IC package assembly to a device-under-test (DUT) board. The DUT board is coupled to the IC package assembly through the PCB substrate.

The method 1000 includes a step 1030 to form a trench that extends through the DUT board, through the PCB substrate, and partially into the IC die. The trench extends from the second side toward the first side. In some embodiments, the step 1030 is performed such that the trench extends at least partially through the second metallization structure. In some embodiments, the first metallization structure includes a plurality of metal layers, and the second metallization structure includes a power delivery network (PDN).

The method 1000 includes a step 1040 to couple, after the trench has been formed, a socket of a testing tool to the DUT board. The coupling of the socket is performed such that the IC package assembly is located between the DUT board and the socket after the socket has been coupled It is understood that additional processes may be performed before, during, or after the steps 1010-1040 of the method 1000. For example, in some embodiments, the method 1000 may further include a step of applying, via the socket and to the IC package assembly, testing signals generated by the testing tool. The testing signals are electrically routed to the IC die through the DUT board and through the PCB substrate. As another example, the method 1000 may further include a step of detecting, via a signal detection tool placed over the second side of the IC package assembly, electrical signals or optical signals emitted by the IC die in response to being applied the testing signals. As a further example, the method 1000 may further include a step of analyzing one or more fault conditions of the IC package assembly based on the detected electrical signals or the detected optical signals. In some embodiments, the testing signals are electrically routed to the IC die further through a plurality of retractable pins located between the socket and the DUT board. In some embodiments, the DUT board includes a plurality of conductive bumps. Each of the retractable pins comes into direct physical contact with a respective one of the conductive bumps as the testing signals are electrically routed to the IC die. In some embodiments, a ratio of a height of each of the retractable pins and a height of the IC package assembly is in a range between about 0.3:1 and about 0.35:1. In some embodiments, the detecting comprises detecting the electrical signals or optical signals via an electron beam tool as the signal detection tool. Other steps may also be performed, but they are not discussed in detail herein for reasons of simplicity.

The present disclosure may offer advantages over conventional devices. However, it is understood that not all advantages are discussed herein, different embodiments may offer different advantages, and that no particular advantage is required for any embodiment. One advantage is that the present disclosure facilitates the debugging process in spite of the presence of metallization components on both the front side and the back side of the IC device. In more detail, conventional IC devices may have metallization structures on the front side, but not the back side. As such, the signal detection tool may be placed on the back side of the IC device to detect signals emitted by the IC device under-test. However, such an approach is more difficult for the IC device herein, since the IC device may have an interconnect structure (including multiple metal layers) formed on its front side and a power delivery network (PDN) (e.g., containing power rails and ground rails in the form of metal lines) formed on its back side. During a debugging process, an automated testing equipment (ATE) tool may feed test signals to the IC device, so that the IC device will operate in a predetermined mode and generate electrical signals or optical signals accordingly. These signals are meant to be detected by a signal detection tool placed at the back side of the IC device. To ensure that the metallization components of the PDN structure do not obstruct the transmission of these electrical or optical signals, an opening or trench is formed that extends into the PDN from the back side of the IC device, so to allow the electrical or optical signals to propagate out of the opening or trench. In more detail, the IC device may be an IC package assembly that includes an IC die and a PCB substrate bonded thereto. The IC package assembly is coupled between a DUT board and a socket of a testing tool. The opening or trench extends through the DUT board and the PCB substrate (and at least partially through the IC die) from the back side, so that the electrical or optical signals emitted by the IC die may propagate out of the opening or trench and reaches the signal detection tool without obstruction. Based on an analysis of the detected signals, the source of the faults causing failures of performance issues for the IC device may be accurately and quickly identified. Other advantages may include compatibility with existing packaging/testing processes and the ease and low cost of implementation.

The advanced lithography process, method, and materials described above can be used in many applications, including in IC devices using fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure involves an apparatus. A socket of a testing tool is configured to provide testing signals. A device-under-test (DUT) board is configured to provide electrical routing. An integrated circuit (IC) die is disposed between the socket and the DUT board. The testing signals are electrically routed to the IC die through the DUT board. The IC die includes a substrate in which plurality of transistors is formed. A first structure contains a plurality of first metallization components. A second structure contains a plurality of second metallization components. The first structure is disposed over a first side of the substrate. The second structure is disposed over a second side of the substrate opposite the first side.

Another aspect of the present disclosure involves a system. An integrated circuit (IC) package assembly includes an IC die and a printed circuit board (PCB) substrate bonded to the IC die. A socket of a testing tool is disposed over a first side of the IC package assembly. A device-under-test (DUT) board is disposed over a second side of the IC package assembly. The DUT board is configured to route testing signals provided by the testing tool from the socket to the IC package assembly. The IC package assembly generates electrical signals or optical signals in response to receiving the testing signals. A trench extends through the DUT board, through the PCB substrate, and partially into the IC die from the second side. A signal detection tool is disposed over the second side of the IC package assembly. The signal detection tool is configured to detect the electrical signals or the optical signals generated by the IC package. The electrical signals or the optical signals propagate toward the second side through the trench.

Yet another aspect of the present disclosure involves a method. An integrated circuit (IC) package assembly is provided. The IC package includes an IC die. The IC die includes a semiconductor substrate, a first metallization structure disposed over a first side of the semiconductor substrate, and a second metallization structure disposed over a second side of the semiconductor substrate opposite the first side. The IC package assembly further includes a printed circuit board (PCB) substrate bonded to the IC die from the second side. The IC package assembly is coupled to a device-under-test (DUT) board. The DUT board is coupled to the IC package assembly through the PCB substrate. A trench is formed that extends through the DUT board, through the PCB substrate, and partially into the IC die. The trench extends from the second side toward the first side. After the trench has been formed, a socket of a testing tool is coupled to the DUT board. The coupling of the socket is performed such that the IC package assembly is located between the DUT board and the socket after the socket has been coupled.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a socket of a testing tool configured to provide testing signals;
   a device-under-test (DUT) board configured to provide electrical routing; and
   an integrated circuit (IC) die disposed between the socket and the DUT board, wherein the testing signals are electrically routed to the IC die through the DUT board, and wherein the IC die includes a substrate in which plurality of transistors is formed, a first structure that contains a plurality of first metallization components, and a second structure that contains a plurality of second metallization components, wherein the first structure is disposed over a first side of the substrate, and wherein the second structure is disposed over a second side of the substrate opposite the first side.

2. The apparatus of claim 1, wherein:
   the DUT board is disposed between a signal detection tool and the IC die;
   the IC die emits electrical signals or optical signals in response to being fed the testing signals that are provided by the socket; and
   the signal detection tool is configured to:
      detect the electrical signals or the optical signals emitted by the IC die;
      analyze the detected electrical signals or the detected optical signals; and
      identify, based on an analysis of the detected electrical signals or the detected optical signals, one or more regions of the IC die that are experiencing or have experienced one or more fault conditions.

3. The apparatus of claim 1, wherein a trench extends through the DUT board and extends partially into the IC die from the second side.

4. The apparatus of claim 3, wherein the electrical or optical signals propagate out of the trench before reaching the signal detection tool.

5. The apparatus of claim 3, wherein the second metallization components are components of a power delivery network (PDN), and wherein the trench extends vertically into the PDN from the second side.

6. The apparatus of claim 1, further comprising a printed circuit board (PCB) substrate that is bonded between the IC die and the DUT board.

7. The apparatus of claim 1, further comprising a plurality of pogo pins located on the socket, wherein the pogo pins are configured to electrically route the testing signals from the socket to the DUT board.

8. The apparatus of claim 7, wherein a ratio of a height of each of the pogo pins and a height of the IC die is in a range between about 10:1 and about 20:1.

9. A system, comprising:
   an integrated circuit (IC) package assembly that includes an IC die and a printed circuit board (PCB) substrate bonded to the IC die;
   a socket of a testing tool disposed over a first side of the IC package assembly;
   a device-under-test (DUT) board disposed over a second side of the IC package assembly, wherein the DUT board is configured to route testing signals provided by the testing tool from the socket to the IC package assembly, wherein the IC package assembly generates electrical signals or optical signals in response to receiving the testing signals, and wherein a trench extends through the DUT board, through the PCB substrate, and partially into the IC die from the second side; and a signal detection tool disposed over the second side of the IC package assembly, wherein the signal detection tool is configured to detect the electrical signals or the optical signals generated by the IC package, and wherein the electrical signals or the optical signals propagate toward the second side through the trench.

10. The system of claim 9, wherein the IC die includes:
a semiconductor substrate in which plurality of transistors is formed;
an interconnect structure disposed over the first side of the semiconductor substrate, wherein the interconnect structure contains a plurality of first metallization components; and
a power delivery network (PDN) disposed over the second side of the semiconductor substrate, wherein the PDN contains a plurality of second metallization components, and wherein the trench extends at least partially through the PDN from the second side.

11. The system of claim 9, wherein:
the socket includes a plurality of retractable conductive pins;
the DUT board includes a plurality of conductive bumps;
each of the retractable conductive pins is electrically coupled to a respective one of a first subset of the conductive bumps; and
the PCB substrate is electrically coupled to a second subset of the conductive bumps.

12. The system of claim 11, wherein:
each of the retractable conductive pins has a first height;
the IC package assembly has a second height; and
a ratio of the first height and the second height is in a range between about 0.3:1 and about 0.35:1.

13. A method, comprising:
providing an integrated circuit (IC) package assembly that includes an IC die, wherein the IC die includes a semiconductor substrate, a first metallization structure disposed over a first side of the semiconductor substrate, and a second metallization structure disposed over a second side of the semiconductor substrate opposite the first side, and wherein the IC package assembly further includes a printed circuit board (PCB) substrate bonded to the IC die from the second side;
coupling the IC package assembly to a device-under-test (DUT) board, wherein the DUT board is coupled to the IC package assembly through the PCB substrate;

forming a trench that extends through the DUT board, through the PCB substrate, and partially into the IC die, wherein the trench extends from the second side toward the first side; and
coupling, after the trench has been formed, a socket of a testing tool to the DUT board, wherein the coupling of the socket is performed such that the IC package assembly is located between the DUT board and the socket after the socket has been coupled.

14. The method of claim 13, further comprising:
applying, via the socket and to the IC package assembly, testing signals generated by the testing tool, wherein the testing signals are electrically routed to the IC die through the DUT board and through the PCB substrate;
detecting, via a signal detection tool placed over the second side of the IC package assembly, electrical signals or optical signals emitted by the IC die in response to being applied the testing signals; and
analyzing one or more fault conditions of the IC package assembly based on the detected electrical signals or the detected optical signals.

15. The method of claim 14, wherein the detecting comprises detecting the electrical signals or optical signals via an electron beam tool as the signal detection tool.

16. The method of claim 14, wherein the testing signals are electrically routed to the IC die further through a plurality of retractable pins located between the socket and the DUT board.

17. The method of claim 16, wherein:
the DUT board includes a plurality of conductive bumps; and
each of the retractable pins comes into direct physical contact with a respective one of the conductive bumps as the testing signals are electrically routed to the IC die.

18. The method of claim 16, wherein a ratio of a height of each of the retractable pins and a height of the IC package assembly is in a range between about 0.3:1 and about 0.35:1.

19. The method of claim 13, wherein the forming the trench is performed such that the trench extends at least partially through the second metallization structure.

20. The method of claim 19, wherein:
the first metallization structure includes a plurality of metal layers; and
the second metallization structure includes a power delivery network (PDN).

* * * * *